(12) United States Patent
Kim et al.

(10) Patent No.: US 7,714,378 B2
(45) Date of Patent: May 11, 2010

(54) NONVOLATILE SEMICONDUCTOR INTEGRATED CIRCUIT DEVICES AND FABRICATION METHODS THEREOF

(75) Inventors: Tae-kyung Kim, Seoul (KR); Jeong-hyuk Choi, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 284 days.

(21) Appl. No.: 11/487,834

(22) Filed: Jul. 17, 2006

(65) Prior Publication Data
US 2007/0034955 A1    Feb. 15, 2007

(30) Foreign Application Priority Data
Aug. 9, 2005    (KR) .................... 10-2005-0072799

(51) Int. Cl.
    *H01L 29/94* (2006.01)
(52) U.S. Cl. ............... 257/319; 257/390; 257/E29.129; 257/E21.179
(58) Field of Classification Search ......... 257/314–316, 257/319, 324, 349–351, 320, E29.129, E29.13, 257/390, E29.158, E21.179
    See application file for complete search history.

(56) References Cited

U.S. PATENT DOCUMENTS

| | | | | |
|---|---|---|---|---|
| 6,100,559 | A * | 8/2000 | Park ........................... | 257/315 |
| 6,117,728 | A * | 9/2000 | Kauffman et al. ........... | 438/257 |
| 6,346,467 | B1 | 2/2002 | Chang et al. ................ | 438/594 |
| 6,437,411 | B1 * | 8/2002 | Choi et al. .................. | 257/413 |
| 6,521,941 | B2 | 2/2003 | Park et al. | |
| 6,570,214 | B1 * | 5/2003 | Wu ............................. | 257/315 |
| 6,630,392 | B2 * | 10/2003 | Kim et al. ................... | 438/586 |
| 6,638,805 | B2 | 10/2003 | Park et al. ................... | 438/233 |
| 6,878,622 | B1 * | 4/2005 | Yang et al. .................. | 438/640 |
| 6,969,650 | B2 | 11/2005 | Yun et al. | |
| 7,154,779 | B2 * | 12/2006 | Mokhlesi et al. ........ | 365/185.01 |
| 2002/0050609 | A1 | 5/2002 | Park et al. | |
| 2002/0190312 | A1 * | 12/2002 | Lee ............................. | 257/321 |
| 2004/0046206 | A1 | 3/2004 | Yun et al. | |
| 2004/0266105 | A1 * | 12/2004 | Jeng et al. ................... | 438/257 |
| 2005/0127428 | A1 * | 6/2005 | Mokhlesi et al. ............ | 257/315 |
| 2006/0079075 | A1 * | 4/2006 | Lee et al. .................... | 438/587 |

FOREIGN PATENT DOCUMENTS

| | | |
|---|---|---|
| JP | 2003-007861 | 1/2003 |
| KR | 20020032760 | 5/2002 |
| KR | 20030037573 | 5/2003 |
| KR | 20040022875 | 3/2004 |
| KR | 10-2004-0058989 | 7/2004 |

* cited by examiner

*Primary Examiner*—Matthew Smith
*Assistant Examiner*—Quovaunda Jefferson
(74) *Attorney, Agent, or Firm*—Mills & Onello, LLP

(57) ABSTRACT

In a method for manufacturing a semiconductor device, an oxide layer, a first polysilicon layer, and a second polysilicon layer are sequentially provided on a substrate. A first hard mask pattern is provided on the second polysilicon layer. The oxide layer, the first polysilicon layer, and the second polysilicon layer are patterned using the first hard mask pattern as a mask to form a lower gate structure including an oxide pattern, a first polysilicon pattern, and a second polysilicon pattern. The lower gate structure is etched to provide an oxidation layer on sidewalls of the lower gate structure. An insulating layer is provided on the lower gate structure including the oxidation layer. The first hard mask pattern is removed to form a first opening in the insulating layer, the first opening exposing the second polysilicon pattern. A metal pattern is formed in the first opening on the second polysilicon pattern, the second polysilicon pattern having the oxidation layer on sidewalls thereof.

11 Claims, 10 Drawing Sheets

NONVOLATILE SEMICONDUCTOR INTEGRATED CIRCUIT DEVICES AND FABRICATION METHODS THEREOF

RELATED APPLICATIONS

This application claims priority under 35 U.S.C. 119 to Korean Patent Application No. 10-2005-0072799 filed on Aug. 9, 2005, the content of which is incorporated herein by reference in its entirety.

FIELD OF THE INVENTION

The present invention relates to nonvolatile semiconductor integrated circuit devices and fabrication methods thereof.

BACKGROUND OF THE INVENTION

Conventional non-volatile memory devices commonly include a floating gate structure that is formed over the channel region of a semiconductor substrate. During fabrication according to a conventional process, a tunneling oxide layer is formed on the channel region and a conductive floating gate layer is formed on the tunneling oxide layer. An inter-gate dielectric layer is formed on the floating gate layer and a conductive control gate layer is formed on the inter-gate dielectric layer. A hard mask pattern, for example comprising silicon nitride, is then applied to a top surface of the resulting structure, and then patterned to define gate patterns. The control gate layer, the inter-gate dielectric layer, the floating gate layer, and the tunneling oxide layer are then etched to form gate patterns, using the hard mask pattern as an etch mask.

In the conventional fabrication process, the resulting gate structure has a relatively high aspect ratio during patterning of the gate structure using the hard mask pattern. A high aspect ratio can lead to problems during the etching process. In addition, mechanical stress between layers is more likely to cause bowing of the resulting gate structures in the case where the structures have a high aspect ratio. Such bowing can, in turn, lead to electrical bridging between adjacent gates, which can cause device failure. Further, in the conventional approach, the control gate comprises a multiple-layered structure that includes an upper layer comprising a silicide material, for example $WSi_x$, which has relatively high resistance properties. Since the control gate is also used as a word line in non-volatile memory devices employing this type of gate structure, a word line of relatively high resistance is formed. This can lead to signal delay in the device, resulting in lower operating speed. Also, the silicide layer can be relatively thick, for example on the order of 1000 angstroms, which contributes to the resulting high aspect ratio of the device. In addition, a lower layer of the control gate comprises a polysilicon material, the outer edges of which can suffer from etch damage during the gate patterning process.

To overcome these limitations, an improved floating gate structure has been devised that is characterized by a reduced aspect ratio and improved resistance properties. In this improved structure, the previous multiple-layered control gate including a lower polysilicon layer and an upper silicide layer is replaced by a multiple-layered control gate including a lower polysilicon layer, an intermediate barrier layer, for example comprising $WN_x$, and an upper metal layer, for example comprising W. The intermediate barrier layer and upper metal layer are relatively thin, for example on the order of 100-300 angstroms, so the resulting aspect ratio of the gate structure is reduced, for example, from about 6.4 in the conventional structure to about 3.1 in the improved structure. The reduced aspect ratio leads to improved reliability in the resulting device, since the likelihood of bowing of the structures is reduced. The intermediate barrier layer further improves adhesion between the upper metal layer and lower polysilicon layer, while at the same time, preventing the silicon atoms of the lower polysilicon layer from reacting with the metal atoms of the metal layer.

In the fabrication process of the improved floating gate structure, a post-oxidation process is performed following etch of the gate patterns, in an effort to mitigate etch damage to sidewalls of the lower polysilicon layer of the control gate. However, as a result of the post-oxidation process, the sidewalls of the metal layer also become oxidized, which can lead to an increase in the resistance of the metal layer, and which can cause delamination between the metal layer and the underlying barrier layer. In addition, following the gate patterning process, polymer particles are difficult to remove. A strong wet etch solvent cannot be applied to remove the polymers because the upper metal layer of the control gate is highly susceptible to wet etch, so exposure to strong wet etch solvents should be limited. The presence of polymer particles between the gates can result in electrical bridging between the gates, which can lead to device failure.

SUMMARY OF THE INVENTION

The present invention is directed to non-volatile semiconductor devices and fabrication methods thereof that address and overcome the limitations of the conventional devices described above. In particular, the non-volatile devices of the present invention include a floating gate structure including a multiple-layered control gate having a reduced aspect ratio, to reduce the likelihood of bowing and associated electrical bridging. In addition, the upper conductive layer of the control gate is not yet formed at the time of gate patterning. As a result, oxidation of the upper conductive layer of the control gate is prevented, and therefore the gate resistance is not increased. Also, polymer removal can be ensured by applying a suitable wet etch solvent when patterning the gate structures, without the risk of causing damage to the upper conductive layer.

In one aspect, the present invention is directed to a method for manufacturing a semiconductor device, comprising: sequentially providing an oxide layer, a first polysilicon layer, and a second polysilicon layer on a substrate; providing a first hard mask pattern on the second polysilicon layer; patterning the oxide layer, the first polysilicon layer, and the second polysilicon layer using the first hard mask pattern as a mask to form a lower gate structure including an oxide pattern, a first polysilicon pattern, and a second polysilicon pattern; oxidizing the lower gate structure to provide an oxidation layer on sidewalls of the lower gate structure; providing an insulating layer on the lower gate structure including the oxidation layer; removing the first hard mask pattern to form a first opening in the insulating layer, the first opening exposing the second polysilicon pattern; and forming a metal pattern in the first opening on the second polysilicon pattern, the second polysilicon pattern having the oxidation layer on sidewalls thereof.

In one embodiment, the metal pattern partially fills the first opening and the method further comprises: enlarging a remaining upper portion of the first opening to form an enlarged first opening; and forming a second hard mask pattern in the first opening on the metal pattern.

In another embodiment the method further comprises: forming a second opening in the insulating layer by etching the insulating layer using the second hard mask pattern as an etch mask, the second opening exposing a portion of the substrate; and filling the second opening with a conductive material to form an inter-layer contact.

In another embodiment, an upper portion of the inter-layer contact has a width that is greater than a lower portion of the inter-layer contact, and the upper portion of the inter-layer contact overlaps a portion of the metal pattern.

In another embodiment, the method further comprises connecting metal patterns of alternate gate structures to form transistor selection lines of a non-volatile memory device.

In another embodiment, the upper portion of the interlayer contact further overlaps an isolation region in the substrate adjacent the lower gate structure.

In another embodiment, the method further comprises providing an inter-gate dielectric layer between the first polysilicon layer and the second polysilicon layer, and wherein patterning further comprises patterning the inter-gate dielectric layer to form an inter-gate dielectric pattern.

In another embodiment, the first polysilicon pattern comprises a floating gate, and the second polysilicon pattern and the metal pattern comprise a control gate, of a non-volatile semiconductor device.

In another embodiment, the inter-gate dielectric layer comprises an oxide/nitride/oxide (ONO) layer.

In another embodiment, the method further comprises forming a barrier layer pattern between the metal pattern and the second polysilicon layer pattern.

In another embodiment, the method further comprises enlarging the first opening prior to forming the metal pattern to form an enlarged first opening and the metal pattern is formed in the enlarged first opening.

In another embodiment, the metal pattern partially fills the enlarged first opening and the method further comprises: further enlarging a remaining upper portion of the enlarged first opening to form a further enlarged first opening; and forming a second hard mask pattern in the further enlarged first opening on the metal pattern.

In another embodiment, oxidizing the lower gate structure comprises heating the lower gate structure and immersing the structure in an atmosphere including oxygen, In another embodiment, providing the oxide layer comprises forming the oxide layer at a first thickness in a first region of the substrate, and forming the oxide layer at a second thickness at a second region of the substrate, wherein the first thickness and the second thickness are different.

In another embodiment, semiconductor devices formed in the first region are field effect transistors and semiconductor devices formed in the second region are floating gate transistors, and the second thickness is greater than the first thickness.

In another embodiment, the method further comprises connecting metal patterns of adjacent gate structures to form one of word lines and bit lines of a semiconductor device.

In another aspect, the present invention is directed to a method for manufacturing a semiconductor device, comprising: sequentially providing a tunnel oxide layer, a floating gate polysilicon layer, an inter-gate dielectric layer and a control gate polysilicon layer on a substrate; providing a first hard mask pattern on the control gate polysilicon layer; patterning the tunnel oxide layer, the floating gate polysilicon layer, the inter-gate dielectric layer and the control gate polysilicon layer using the first hard mask pattern as a mask to form a lower gate structure including a tunnel oxide pattern, a floating gate polysilicon pattern, an inter-gate dielectric pattern and a control gate polysilicon pattern; oxidizing the lower gate structure to provide an oxidation layer on sidewalls of the lower gate structure; providing an insulating layer on the lower gate structure including the oxidation layer; removing the first hard mask pattern to form a first opening in the insulating layer, the first opening exposing the control gate polysilicon pattern; and forming a metal pattern in the first opening on the control gate polysilicon pattern, the control gate polysilicon pattern having the oxidation layer on sidewalls thereof.

In one embodiment, the inter-gate dielectric layer comprises an oxide/nitride/oxide (ONO) layer.

In another embodiment, oxidizing the lower gate structure comprises heating the lower gate structure and immersing the structure in an atmosphere including oxygen, In another embodiment, the metal pattern partially fills the first opening and the method further comprises: enlarging a remaining upper portion of the first opening to form an enlarged first opening; and forming a second hard mask pattern in the first opening on the metal pattern.

In another embodiment, the method further comprises: forming a second opening in the insulating layer by etching the insulating layer using the second hard mask pattern as an etch mask, the second opening exposing a portion of the substrate; and filling the second opening with a conductive material to form an inter-layer contact.

In another embodiment, an upper portion of the inter-layer contact has a width that is greater than a lower portion of the inter-layer contact, and the upper portion of the inter-layer contact overlaps a portion of the metal pattern.

In another embodiment, the method further comprises connecting metal patterns of alternate gate structures to form transistor selection lines of a non-volatile memory device.

In another embodiment, the upper portion of the interlayer contact further overlaps an isolation region in the substrate adjacent the lower gate structure.

In another embodiment, the method further comprises forming a barrier layer pattern between the metal pattern and the control gate polysilicon layer pattern.

In another embodiment, the method further comprises enlarging the first opening prior to forming the metal pattern to form an enlarged first opening and the metal pattern is formed in the enlarged first opening.

In another embodiment, the metal pattern partially fills the enlarged first opening and the method further comprises: further enlarging a remaining upper portion of the enlarged first opening to form a further enlarged first opening; and forming a second hard mask pattern in the further enlarged first opening on the metal pattern.

In another embodiment, providing the oxide layer comprises forming the oxide layer at a first thickness in a first region of the substrate, and forming the oxide layer at a second thickness at a second region of the substrate, wherein the first thickness and the second thickness are different.

In another embodiment, semiconductor devices formed in the first region are field effect transistors and wherein semiconductor devices formed in the second region are floating gate transistors, and wherein the second thickness is greater than the first thickness.

In another embodiment, the method further comprises connecting metal patterns of adjacent gate structures to form one of word lines and bit lines of a semiconductor device.

In another aspect, the present invention is directed to a semiconductor device comprising: a semiconductor substrate; a tunnel oxide layer pattern on the substrate; a floating gate polysilicon layer pattern on the tunnel oxide layer pattern; an inter-gate dielectric layer pattern on the floating gate polysilicon layer pattern; a control gate polysilicon layer pattern on the inter-gate dielectric layer pattern; a control gate metal layer pattern on the control gate polysilicon layer pattern, wherein a width of the control gate metal layer pattern is greater than a width of the control gate polysilicon layer pattern.

In one embodiment, the tunnel oxide layer pattern, the floating gate polysilicon layer pattern, the inter-gate dielectric layer pattern, the control gate polysilicon layer pattern and the control gate metal layer pattern comprise a floating gate structure and the floating gate structure is on an active region of the semiconductor substrate, and source and drain regions are in the semiconductor substrate adjacent sidewalls of the floating gate structure.

In another embodiment, multiple floating gate structures are provided on the semiconductor substrate and further comprising an insulating layer on the substrate and on the multiple floating gate structures, and further comprising an inter-layer contact in the insulting layer between a pair of the multiple floating gate structures.

In another embodiment, the inter-layer contact has an upper portion that is wider than a lower portion thereof, and wherein the upper portion of the inter-layer contact overlaps a portion of the control gate metal layer pattern.

In another embodiment, wherein the control gate metal layer patterns of adjacent floating gate structures are connected to provide one of word lines and bit lines of the semiconductor device.

In another embodiment, the device further comprises a hard mask pattern on the control gate metal layer pattern, wherein a width of the hard mask pattern is greater than a width of the control gate metal layer pattern, and wherein the hard mask pattern is used for self-alignment of the inter-layer contact.

In another aspect, the present invention is directed to a semiconductor device comprising: a semiconductor substrate; multiple gate structures, each comprising: a tunnel oxide layer pattern on the substrate; a first polysilicon layer pattern on the tunnel oxide layer pattern; a second polysilicon layer pattern on the first polysilicon layer pattern; a metal layer pattern on the second polysilicon layer pattern; and a hard mask pattern on the metal layer pattern, wherein a width of the hard mask pattern is greater than a width of the metal layer pattern; an insulating layer on the substrate and on the multiple gate structures; and an inter-layer contact in the insulting layer between a pair of the multiple gate structures, wherein the hard mask pattern is used for self-alignment of the inter-layer contact.

In one embodiment, a width of the metal layer pattern is greater than a width of the second polysilicon layer pattern.

In another embodiment, the first polysilicon layer pattern has a dopant concentration that is different than the second polysilicon layer pattern.

In another embodiment, the device further comprises an inter-gate dielectric layer pattern on the first polysilicon layer pattern, and wherein the semiconductor device comprises a floating gate device.

In another embodiment, the semiconductor device comprises a field effect transistor.

In another embodiment, the semiconductor device further comprises source and drain regions in the semiconductor substrate adjacent sidewalls of the gate structures.

In another embodiment, the inter-layer contact has an upper portion that is wider than a lower portion thereof, and the upper portion of the inter-layer contact overlaps a portion of the metal layer pattern.

In another embodiment, the metal layer patterns of adjacent gate structures are connected to provide one of word lines, bit lines, and transistor selection lines of the semiconductor device.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF EMBODIMENTS OF THE INVENTION

The present invention will now be described more fully hereinafter with reference to the accompanying drawings, in which preferred embodiments of the invention are shown. This invention may, however, be embodied in different forms and should not be construed as limited to the embodiments set forth herein. In the drawings and related description, if a first layer is referred to as being "on" another layer, the first layer can be directly on the other layer, or intervening layers may be present. Like numbers refer to like elements throughout the specification.

Figure 1:
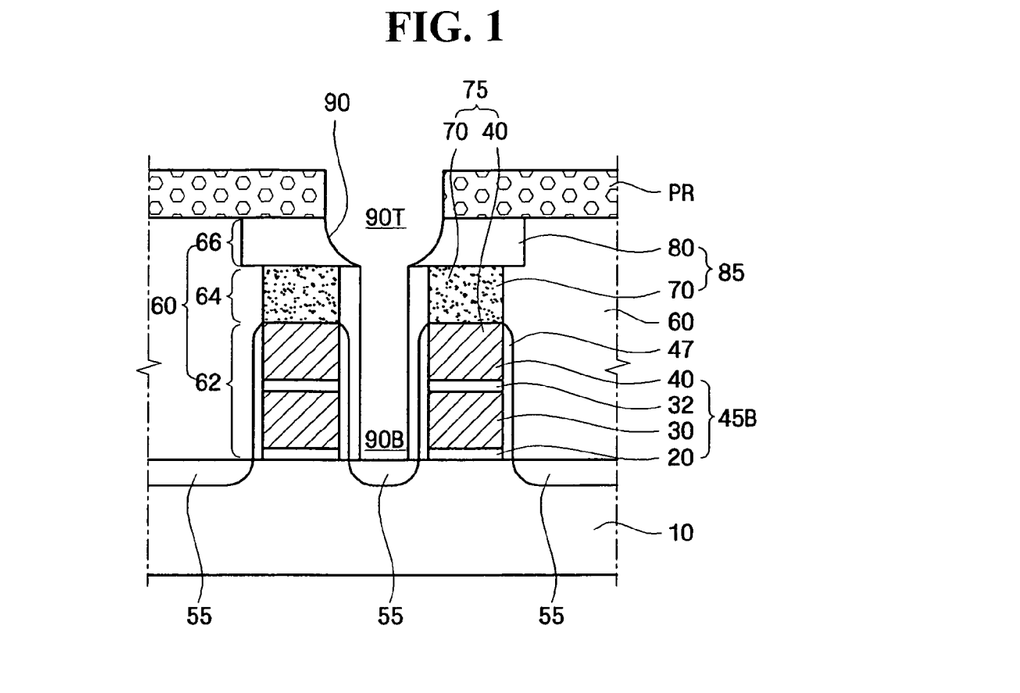
FIG. 1 is a sectional view of a non-volatile semiconductor device in accordance with a first embodiment of the present invention.

FIG. 1 is a sectional view of a non-volatile semiconductor device in accordance with a first embodiment of the present invention. The view of FIG. 1 illustrates a dual non-volatile floating gate transistor device in a memory cell region of a device during fabrication. First and second floating gate structures are formed on a substrate 10. The floating gate structures share a common source or drain 55 that is formed in the substrate between them. Each floating gate structure includes a tunnel oxide layer pattern 20, a floating gate pattern 30, an inter-gate dielectric layer pattern 32, a lower conductive pattern 40 and an upper conductive pattern 70. Together, the lower conductive pattern 40 and the upper conductive pattern 70 form a control gate 75 for the device. A mask pattern 80 is provided on the upper conductive pattern. An optional barrier layer pattern (not shown) can be applied between the lower conductive pattern 40 and the upper conductive pattern 70 of the control gate 75.

During fabrication, the tunnel oxide layer pattern 20, floating gate pattern 30, inter-gate dielectric layer pattern 32, and lower conductive pattern 40 together provide a bottom gate structure 45 that is initially formed and patterned on the substrate 10. After formation and patterning of the bottom gate structure 45, insulative sidewall spacers 47 are applied to sidewalls of the bottom gate structure 45. Following this, the upper conductive pattern 70 and mask pattern 80 are formed together to provide an upper gate structure 85. An interlayer dielectric insulating layer 60 is provided about the floating gate structures, and can be considered to include a first portion 62 of a height that corresponds to that of the bottom gate structure 45, a second portion 64 of a height that corresponds to the height of the upper conductive pattern 70, and a third portion 66 of a height that corresponds to the height of the hard mask pattern 80.

In one embodiment, the width of the mask pattern 80 is greater than the width of the underlying control gate 75 comprising the upper conductive pattern 70 and lower conductive pattern 40, and greater than the width of the underlying floating gate pattern 30. This is accomplished, for example, by enlarging the openings that define the upper conductive patterns 70 in the interlayer dielectric insulating layer 60 following deposit of the upper conductive patterns 70 using a wet cleaning process. Widened mask patterns 80 allow for later self-alignment of the contact holes 90 between adjacent memory cells, to enable increased integration of the cells, while improving device reliability. During formation of the contact holes 90, a photoresist layer PR layer is applied and patterned to define the positions of the contact holes 90. The contact holes have top portions 90T that are greater in width than bottom portions 90B thereof. Conductive contacts are then formed in the self-aligned contact holes 90.

According to the present invention, since the bottom gate structure 45 is formed and patterned prior to formation of the upper conductive patterns 70, and since the inter-layer dielectric insulating layer 60 is formed prior to formation of the upper conductive pattern 70, the upper conductive patterns 70, which provide word lines of the resulting device, can be as thick as desired, for achieving a suitable resistance property in the layer, without concern over increasing the aspect ratio of the device. Also, after patterning the bottom gate structure 45, any remaining polymer particles can be readily removed from regions between the gate structures due to the reduced aspect ratio of the structures at the time of patterning. Also, appropriate etch solvents can be used to ensure full removal of polymer particles between neighboring devices without concern over causing harm to the upper conductive patterns 70, since the metal layer patterns are not present at that time. In addition, since a post oxidation procedure is not needed after formation of the metal layer, oxidation of the upper conductive patterns 70 is avoided, and concern over increasing the resistance due to such oxidation is eliminated. Further, concern over bowing of the gate structures due to mechanical stress resulting from such oxidation is eliminated.

Figure 2:
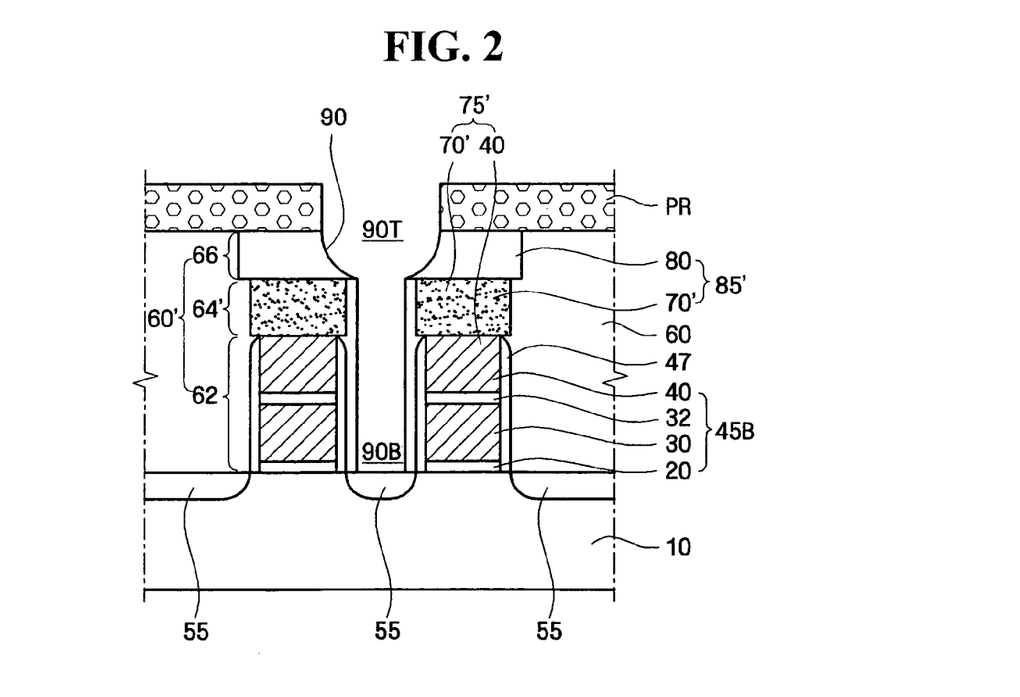
FIG. 2 is a sectional view of a non-volatile semiconductor device in accordance with a second embodiment of the present invention.

FIG. 2 is a sectional view of a non-volatile semiconductor device in accordance with a second embodiment of the present invention. The second embodiment shares many of the features of the embodiment described above in connection with FIG. 1. A difference lies in that in the FIG. 2 embodiment, the upper conductive patterns 70' of the control gate 75' are of a width that is greater than a width of the underlying lower conductive patterns 40 of the control gate 75'. In addition, like the FIG. 1 embodiment, the width of the mask patterns 80 are of a width that is greater than a width of the underlying upper conductive patterns 70'. This is accomplished, for example, by enlarging the openings in the inter-layer dielectric insulating layer 60 prior to deposit of the upper conductive patterns 70' using a wet cleaning process, as described in further detail below. This configuration achieves a lowered resistance in the upper conductive layer 70' due to its increased width. At the same time, the widened mask patterns 80 allow for later self-alignment of the contact holes 90 between adjacent memory cells, to enable increased integration of the cells, while improving device reliability, as described above.

Figure 3:
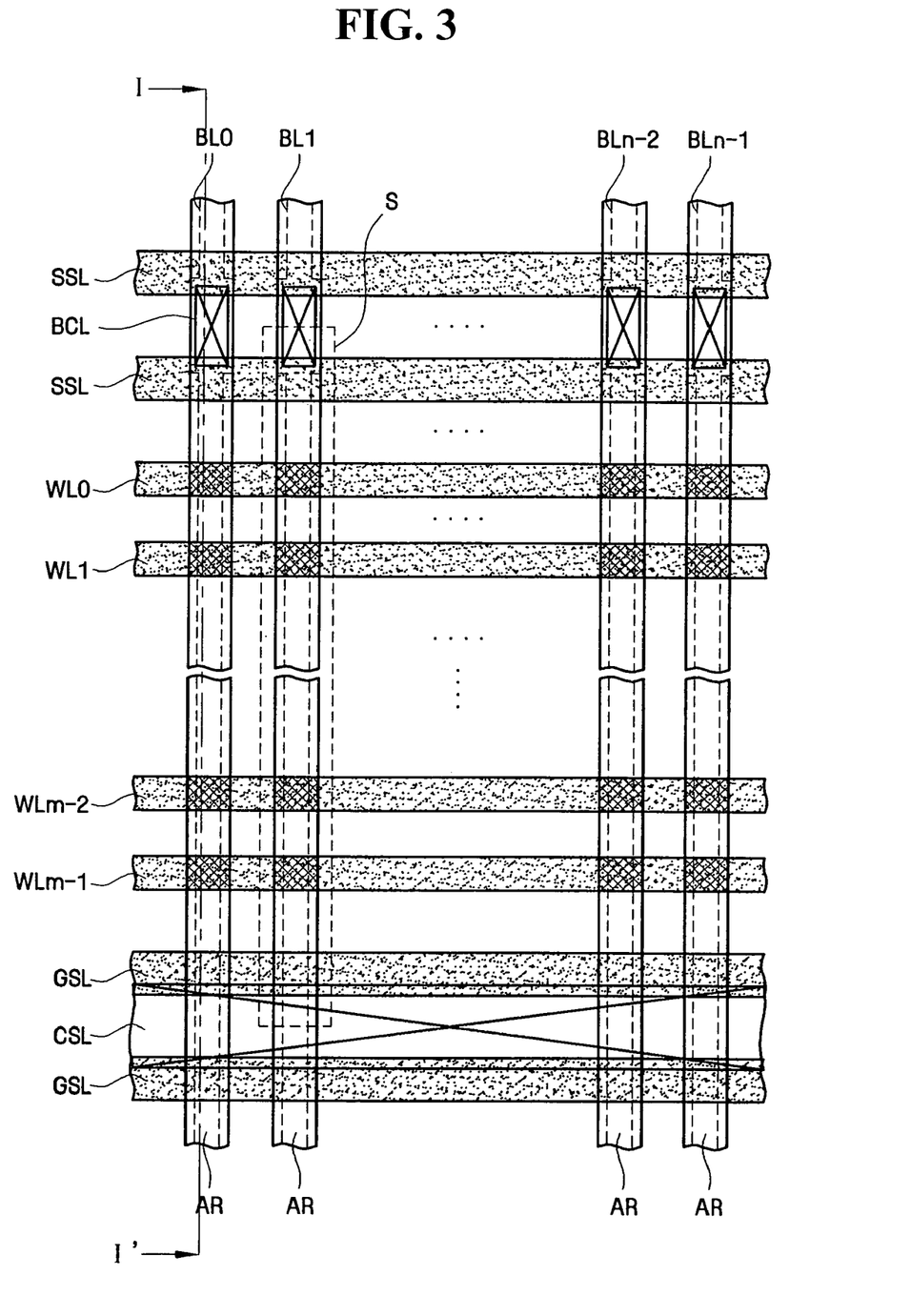
FIG. 3 is a layout diagram of a NAND-type flash memory.

FIG. 3 is a layout diagram of a NAND-type flash memory in accordance with the present invention. In the layout diagram, it can be seen that a plurality of word lines WL0 . . . WLm−2 extend in a horizontal direction, while a plurality of bit lines BL0 . . . BLn31 1 extend in a vertical direction. The bit lines BL0 . . . BLn−1 correspond with active regions AR of underlying transistors. The word lines WL0 . . . WLm−2 correspond with the upper conductive layers 70, 70' of the memory cells of FIGS. 1 and 2. Dual string selection lines SSL extend in a horizontal direction across a top portion of the device parallel to the word lines WL0 . . . WLm−2, and dual ground selection lines GSL extend in a horizontal direction across a bottom portion of the device parallel to the word lines WL0 . . . WLm−2. Bit line contacts BLC are provided to connect between the individual bit lines BL0 . . . BLn−1 and common drains of each of the string selection lines SSL. Common sources of ground selection transistors are connected to the ground selection lines GSL by a common source line CSL. In this configuration, a unit string S of memory cells comprises a string selection transistor SST, a ground selection transistor GST, and a string of intervening memory cell transistors.

Figure 4A:
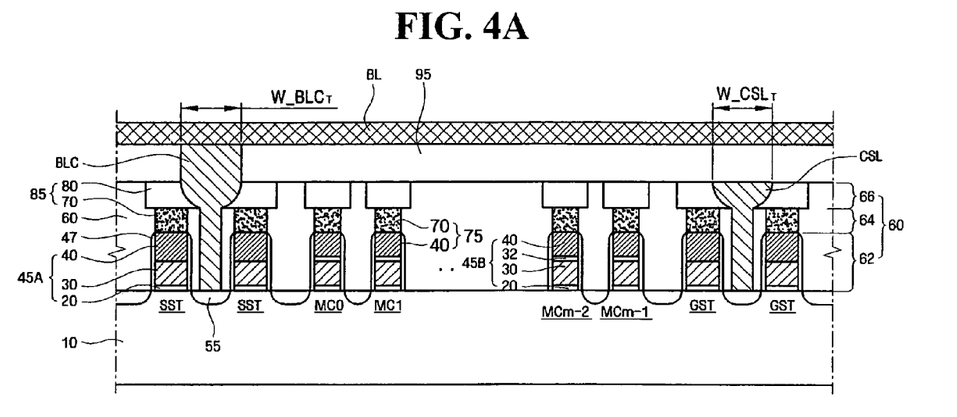
FIG. 4A is a sectional view taken along section line I-I' of the layout diagram of FIG. 3, in accordance with the first embodiment of the present invention.

FIG. 4A is a sectional view taken along section line I-I' of the layout diagram of FIG. 3, in accordance with the first embodiment of the present invention. In this view, it can be seen that the contact connecting the common source line CSL with the underlying common sources of the ground selection transistors GST is formed and connected in an arrangement that is similar to the configuration of the self-aligned contacts of the memory cell transistors of the FIG. 1 embodiment above. In particular, the width of mask patterns 80 of the gate structures of the ground selection transistors GST is greater than the widths of the underlying gate layers 70, 40, 30. As described above, this allows for self-alignment of the contacts CSL between the gates of the neighboring ground selection transistors GST. Similarly, in this view, it can be seen that the contact connecting the bit line BL with the underlying common drain of the string selection transistors SST is likewise formed and connected in an arrangement that is similar to the configuration of the self-aligned contacts of the FIG. 1 embodiment above. In particular, the width of the mask patterns 80 is greater than the width of the underlying gate layers 70, 40, 30. As described above, this allows for self-alignment of the contact hole openings of the resulting contacts BLC between the gates of the neighboring string selection transistors GST. This is described in further detail below in connection with the process of FIG. 7.

Figure 4B:
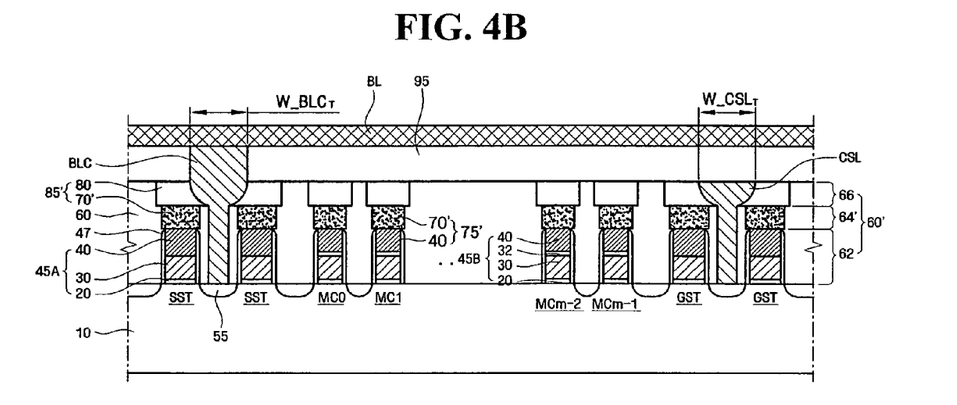
FIG. 4B is a sectional view taken along section line I-I' of the layout diagram of FIG. 3, in accordance with the second embodiment of the present invention.

FIG. 4B is a sectional view taken along section line I-I' of the layout diagram of FIG. 3, in accordance with the second embodiment of the present invention. As mentioned above in connection with FIG. 2, the second embodiment shares many of the features of the embodiment described above in connection with FIGS. 1 and 3. A difference lies in that in the FIG. 4 embodiment, the upper conductive patterns 70' of the gates of the string selection transistors SST and of the ground selection transistors GST are of a width that is greater than a width of the underlying lower gate layers 40, 30. Therefore, the resistance of the corresponding string selection lines SSL, ground selection lines, and word lines WL can be reduced.

Figure 5A:
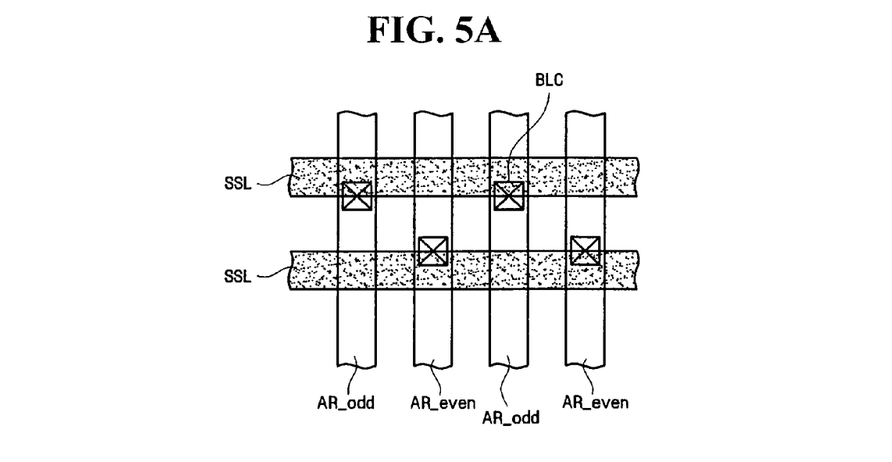
FIGS. 5A and 5B are plan views of first and second configurations of bit line contacts at the intersection of active regions in the vertical direction, and string selection lines in the horizontal direction, illustrating the prevention of shorting between adjacent bit line contacts, in accordance with the present invention.
Figure 5B:
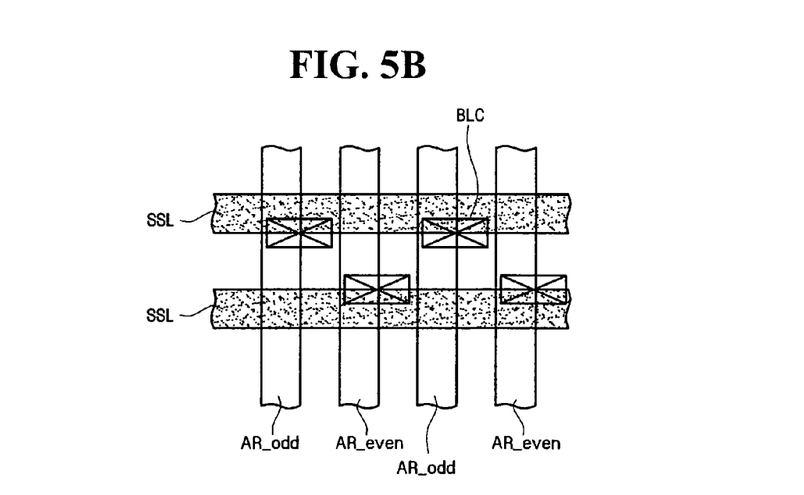

FIGS. 5A and 5B are plan views of first and second configurations of bit line contacts at the intersection of active regions in the vertical direction, and string selection lines in the horizontal direction, illustrating the prevention of shorting between adjacent bit line contacts, in accordance with the present invention. In this example, it can be seen that the bit line contacts BLC need not be centered between neighboring string selection lines SSL, but instead can be patterned in a zig-zag pattern. Since the openings of the bit line contacts BLC can be located, according to the present invention, at self-aligned positions relative to the string selection lines SSL formed by the upper conductive layer 70, 70', as defined by the width of the mask patterns 80, the bit line contacts BLC can be patterned as shown so that their top portions partially overlap with a portion of one of the string selection lines SSL. The bit line contacts BLC can alternate between the top and bottom string selection lines SSL to provide adequate distance between the bit line contacts BLC to prevent shorting between adjacent bit line contacts BLC. The zig-zag patterning also allows the neighboring active regions AR_even, AR_odd to be placed closer together, because of the relative distance between neighboring bit line contacts BLC. In the example of FIG. 5B, it can be seen that the self-aligned bit line contacts can be patterned so that their top portions further partially overlap with underlying isolation regions between neighboring active regions AR_even, AR_odd.

Figure 6:
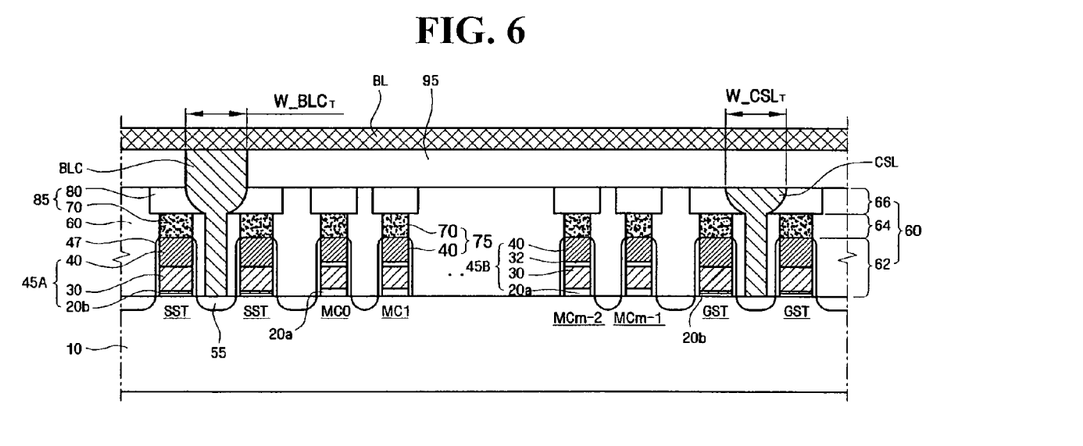
FIG. 6 is a sectional view taken along section line I-I' of the layout diagram of FIG. 3, in accordance with a third embodiment of the present invention.

FIG. 6 is a sectional view taken along section line I-I' of the layout diagram of FIG. 3, in accordance with a third embodiment of the present invention. The third embodiment shares many of the features of the first and second embodiments of FIGS. 1, 2, 4A, and 4B above. However, in the third embodiment of FIG. 6, the thickness of the thermal oxide layer 20a for the memory cell MC0, MC1 . . . MCm−2, MCm−1 transistors is greater than the thickness of thermal oxide layer 20b for the string select transistors SST, and the ground select transistors GST. In addition, the gate length L1 of the memory cell MC0, MC1 . . . MCm−2, MCm−1 transistors is less than the gate length L2 of the string select transistors SST, and the ground select transistors GST. This is desired for increased integration in the memory cell transistors, while preventing transistor breakdown and alleviating process restraints in the SST and GST transistors. A relatively thick thermal oxide layer 20a for the memory cells is desired for data retention and minimization of leakage current, and of corresponding loss of charge, in the floating gate memory cells. At the same time, a relatively thin thermal oxide layer 20b is desired for enhanced transistor performance and rapid switching operation in the string select transistors SST and the ground select transistors GST.

FIGS. 7A-7J are sectional views of a method of fabricating a non-volatile semiconductor device of the first embodiment, in accordance with the present invention.

Figure 7A:
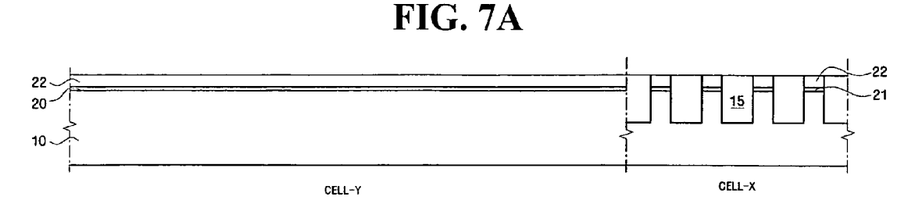
FIGS. 7A-7J are sectional views of a method of fabricating a non-volatile semiconductor device of the first embodiment, in accordance with the present invention.

Referring to FIG. 7A cross-sections of the memory cell region of the device are provided in a horizontal direction CELL-X and in a vertical direction CELL-Y. A buffer oxide layer 21 is formed on a semiconductor substrate 10. In one embodiment, the buffer oxide layer 21 comprises silicon oxide formed to a thickness of about 100 angstroms. This prevents damage to the substrate surface during trench formation and during any ion implantation that is performed. A hard mask layer 22 is formed and patterned on the buffer oxide layer 21. In one embodiment, the hard mask layer 22 comprises silicon nitride, formed to a thickness of about 1000-2000 angstroms. The hard mask layer 22 is patterned using photolithographic techniques, and the buffer oxide layer 21 is etched using the patterned hard mask as an etch mask to expose the underlying substrate 10. Trenches are then formed in the substrate 10, and the trenches are filled with high density plasma (HDP) oxide or USG oxide to provide trench isolation patterns 15 distributed along the horizontal axis of the cell region of the FIG. 3 layout diagram. The trenches 15 define neighboring active regions of the device.

Figure 7B:
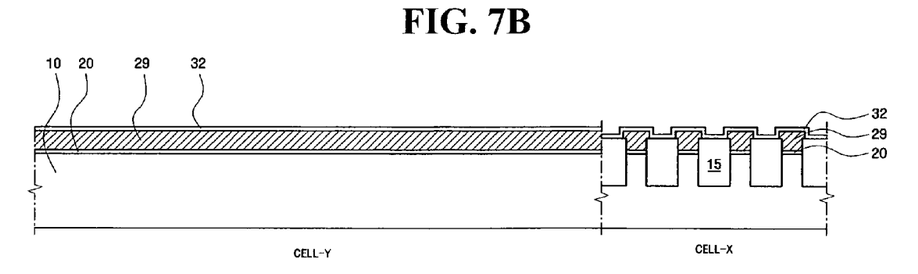

Referring to FIG. 7B, the hard mask layer 22 and the buffer oxide layer 21 are removed, and a tunnel oxide layer 20 is provided on the substrate, for example to a thickness of about 60-80 angstroms. The tunnel oxide layer 20 provides a consistent oxide layer for further device formation, replacing the previously applied buffer oxide layer 21, which could have been damaged during trench formation, or during ion implantation. A first polysilicon layer 29 is provided on the tunnel oxide layer 20. In one embodiment, the first polysilicon layer 29 comprises polysilicon that is doped with impurities so that it has conductive properties to a thickness of about 400-800 angstroms, for example 500 angstroms. The first polysilicon layer should exhibit suitable surface morphology characteristics and optimized grain boundaries. An inter-gate dielectric layer 32 is formed on the first polysilicon layer 29 and the trench isolation patterns 15 as shown. In one embodiment, the inter-gate dielectric layer 32 comprises a multiple-layered dielectric comprising an oxide-nitride-oxide (ONO) structure to a thickness of about 150 angstroms. The ONO structure should exhibit favorable breakdown voltage, leakage current, and charge trapping characteristics.

Figure 7C:
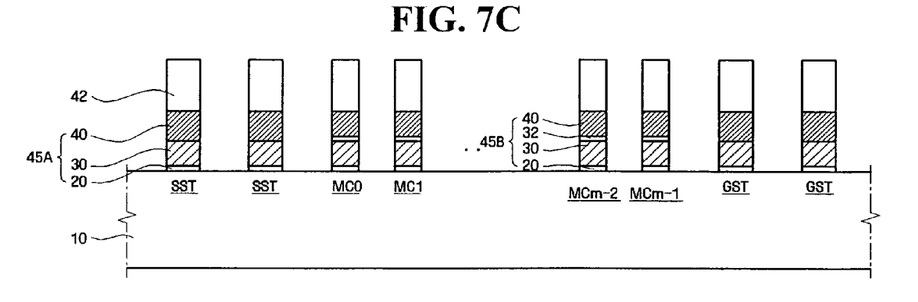

Referring to FIG. 7C, in this sectional view, the memory cell region including memory cell gate structures for memory cell transistors MC0, MC1 . . . MCm−2, MCm−1 is shown along with gate structures for the string select transistors SST and ground select transistors GST at sides of the memory cell regions. In this view, it can be seen that the inter-gate dielectric layer 32 formed in the memory cell region is not provided in the gates of the string select transistors SST and the ground select transistors GST, since the string select transistors SST and the ground select transistors GST are not storage devices, and therefore do not require floating gates.

A second polysilicon layer 40 is formed on the first polysilicon layer 30 of the string select transistors SST and the ground select transistors GST, and the second polysilicon layer 40 is formed on the inter-gate dielectric layer 32 in the memory cell region of the device. In one embodiment, the second polysilicon layer 40 comprises polysilicon that is doped with impurities so that it has favorable conductive properties. In the memory cell region, the second polysilicon layer 40 provides a first conductive layer for a control gate of the floating gate device. In one embodiment, the second polysilicon layer has a dopant concentration that is different than that of the first polysilicon layer.

A gate hard mask layer 42 is provided on the second polysilicon layer 40. In one embodiment, the gate hard mask layer 42 exhibits favorable anti-reflective properties, with etch resistance, low mechanical stress, and contamination protective qualities. The gate hard mask layer 42 is patterned using conventional photolithography techniques, and the underlying second polysilicon layer 40, inter-gate dielectric layer 32, first polysilicon layer 30 and tunnel oxide layer 20 are etched using the gate hard mask layer 42 as an etch mask. Together, each resulting stacked pattern of the tunnel oxide layer 20, the first polysilicon layer 30 and the second polysilicon layer 40 form a lower gate structure 45A for the string select transistors SST and the ground select transistors GST. Similarly, each stacked pattern of the tunnel oxide layer 20, the first polysilicon layer 30, the first inter-gate dielectric layer 32 and the second polysilicon layer 40 form a lower gate structure 45B for the memory cell MC0, MC1 . . . MCm−2, MCm−1 transistors.

Figure 7D:
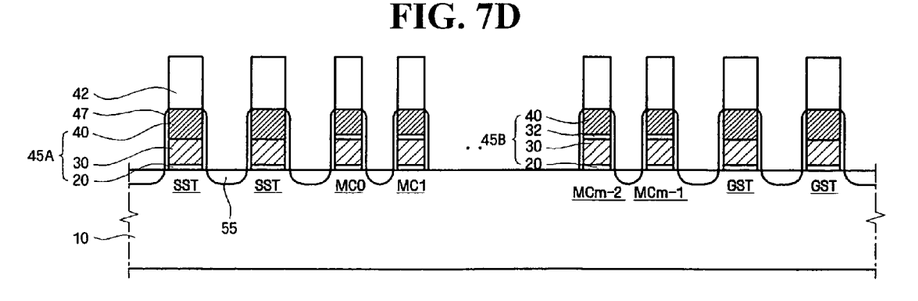

Referring to FIG. 7D, a post-oxidation process is performed, resulting in the formation of thermal oxide sidewall spacers 47 being formed on sidewalls of the lower gate structures 45A, 45B. Following formation of the thermal oxide sidewall spacers 47, source/drain regions 55 are formed in the substrate between adjacent gates using the lower gate structures 45 and associated hard mask structures 42 and spacers 47 as an ion implantation mask.

Figure 7E:
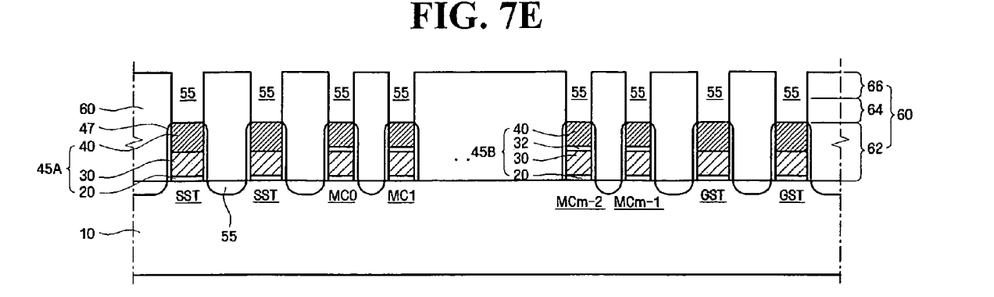

Referring to FIG. 7E, an interlayer dielectric insulating layer 60 is provided on the resulting structure. In one embodiment, the interlayer dielectric insulating layer 60 exhibits favorable gap filling qualities, and has a low dielectric constant (low-k), low mechanical stress, resistance to mobile ions, and resistance to deposition damage. A planarization process, for example a chemical-mechanical polishing process, is performed to planarize a top surface of the interlayer dielectric insulating layer 60. Following this, selective removal of the nitride hard mask pattern 42 is performed, resulting in the formation of first openings 55 in the interlayer dielectric insulating layer 60 above the second polysilicon layer pattern 40 of each of the lower gate structures 45A, 45B.

Figure 7F:
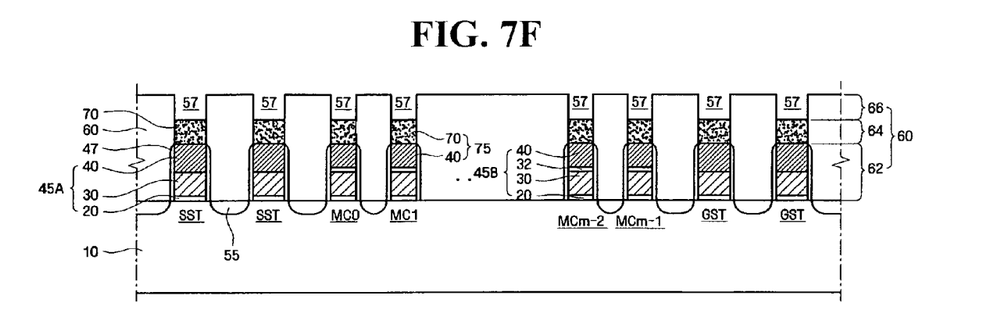

Referring to FIG. 7F, a metal fill layer is provided on the resulting structure, filling the first openings 55 with metal. The metal fill layer is planarized, for example using chemical-mechanical polishing, to expose the planar upper surface of the underlying interlayer dielectric insulating layer 60, thereby separating the metal fill layer into metal patterns 70. The metal patterns 70 are then further recessed into the first openings 55 using an etch back procedure, resulting in the formation of recessed metal patterns 70 on the second polysilicon layer patterns 40, and second openings 57 in the interlayer dielectric insulating layer 60 above the recessed metal patterns 70. Together, each second polysilicon layer pattern 40 and associated recessed metal pattern 70 form a control gate 75—for the memory cell MC0, MC1 . . . MCm−2, MCm−1 transistors, with the recessed metal patterns 70 providing a second conductive layer for the control gate. The metal fill layer comprises, for example W, Ni, Co, Ru—Ta, Ni—Ti, Ti—Al—N, Zr, Hf, Ti, Ta, Mo, Ta—Pt, WN, Ta—Ti, W—Ti, TiN, TaN, TaCN, MoN, WSix, CoSix, NiSix, or other suitable conductive material. At this time, conceptually, the interlayer dielectric layer can be considered to comprise three portions, a first portion 62 corresponding with the lower gate structures 45A, 45B, a second portion 64 corresponding with the recessed metal patterns 70, and a third portion 66, corresponding with the second openings 57.

In an alternative embodiment, an optional barrier metal pattern, for example comprising WNhd x, or other suitable barrier metal layer; can be provided on the second polysilicon layer pattern 40 prior to application of the metal layer to improve conductivity at the junction of the second polysilicon layer pattern 40 and the resulting metal patterns 70. The optional barrier metal pattern layer promotes adhesion between the metal patterns 70 and the second polysilicon layer patterns 40, while at the same time, preventing silicon atoms of the second polysilicon layer patterns 40 from reacting with the metal atoms of the metal patterns 70, and preventing oxidation of exposed metal.

Figure 7G:
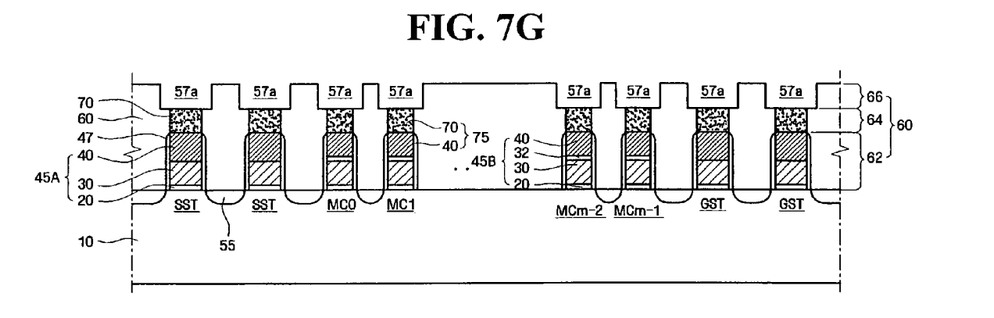

Referring to FIG. 7G, the second openings 57 of the interlayer dielectric insulating layer 60 are enlarged in an enlargement process to form enlarged third openings 57a for gate patterns of the memory cell MC0, MC1 . . . MCm−2, MCm−1 transistors, the string select transistors SST, and the ground select transistors GST. In one embodiment, the enlargement process comprises a wet cleaning process or an isotropic wet etch process. The third openings 57a are used in subsequent processes to define the resulting positions of self-aligned bit line contacts between adjacent string select transistors SST, and common source line contacts between adjacent ground select transistors GST. The enlargement process enables self-alignment of the bit line contacts, as will be described below. The enlargement process should be applied without further etching the lower metal pattern 70 and dielectric insulating layer 60.

Figure 7H:
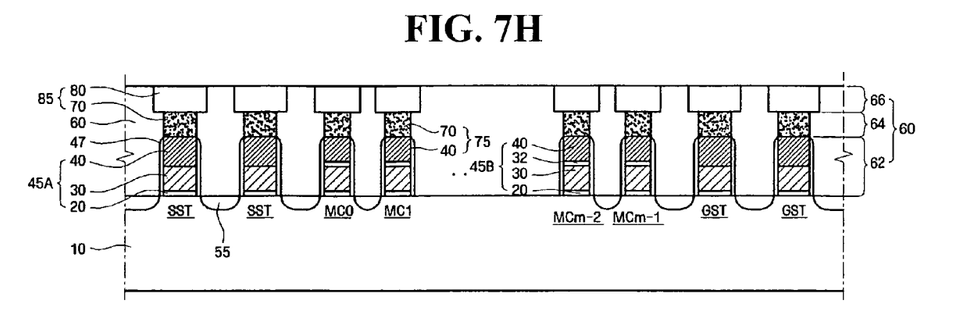

Referring to FIG. 7H, a mask layer, for example comprising silicon nitride, is applied to the resulting structure, filling the third openings 57a. The resulting structure is then planarized to expose the underlying interlayer dielectric insulating layer 60, and to separate the mask layer into a mask layer pattern 80. Together, each corresponding metal pattern 70 and mask layer pattern 80 comprises an upper gate structure 85. Each mask layer pattern 80 has a width that is greater than a width of the corresponding underlying metal pattern 70 as a result of the wet cleaning process that enlarged the second openings 57. The increased width facilitates self-alignment of interlayer contacts, as will be described in further detail below.

Figure 7I:
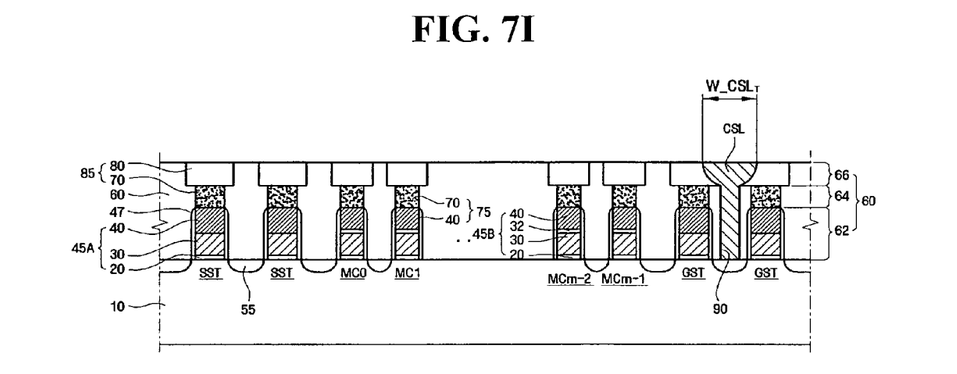

Referring to FIG. 7I, common source line CSL contacts are formed in the interlayer dielectric insulating layer 60 between adjacent ground select transistors GST. Source contact holes 90 are formed in the interlayer dielectric insulating layer 60 between adjacent corresponding mask layer patterns 80 corresponding to the adjacent ground select transistors GST. An etch mask is applied to the remainder of the device, and the source contact holes 90 are patterned using an applied photoresist and etched until the upper surface of the substrate corresponding to the common source of the adjacent ground select transistors GST is exposed. A metal fill is applied to the resulting holes 90, and planarized to provide a common source line CSL. A width of the top portion of the common source line $W\_CSL_T$ is greater than a width of the bottom portion of the common source line $W\_CSL_B$. This is because, while the photoresist pattern has openings of a width that correspond with the width of the top portion $W\_CSL_T$ of the common source line CSL, during etch, the mask layer patterns 80 limit the width of the lower part of the openings 90.

Figure 7J:
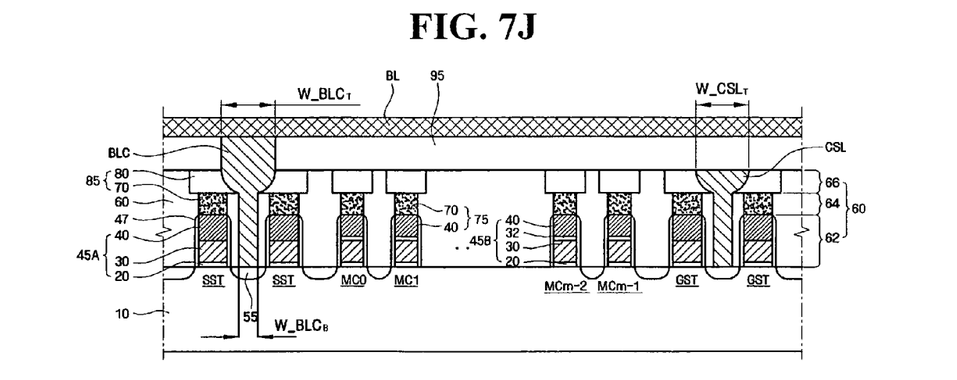

Referring to FIG. 7J, an interlevel insulating layer 95 comprising a dielectric material is provided on the resulting structure. Bit line contacts BLC are formed in the interlevel insulating layer 95 and in the interlayer dielectric insulating layer 60 between adjacent string select transistors SST. Drain contact holes 97 are formed in the interlevel insulating layer 95 and in the interlayer dielectric insulating layer 60 between adjacent corresponding mask layer patterns 80 corresponding to the adjacent string select transistors SST. The drain contact holes 97 are etched until the upper surface of the substrate corresponding to the common drain of the adjacent string select transistors SST is exposed. A metal fill is applied to the resulting holes 97, and planarized to provide bit line contacts BLC. A width of the top portion of the bit line contact W_BLCT is greater than a width of the bottom portion of the bit line contact W_BLCB. A conductive bit line BL is then formed and patterned over the resulting structure in contact with the bit line contacts BLC. The bit line BL can optionally be formed at the same time the bit line contact BLC is formed, or can be formed subsequent to forming the bit line.

It should be noted that the drawing of FIG. 7J is for a NAND-type flash device, and therefore, the contacts, BLC, CSL are shown only between respective SST and GST transistors. However, in a NOR-type flash device, similar contacts can additionally be provided between the respective memory cell transistors MC0, MC1, . . . as well. The present invention applies to both NAND-type and NOR-type devices, as well as other devices.

Figure 8A:
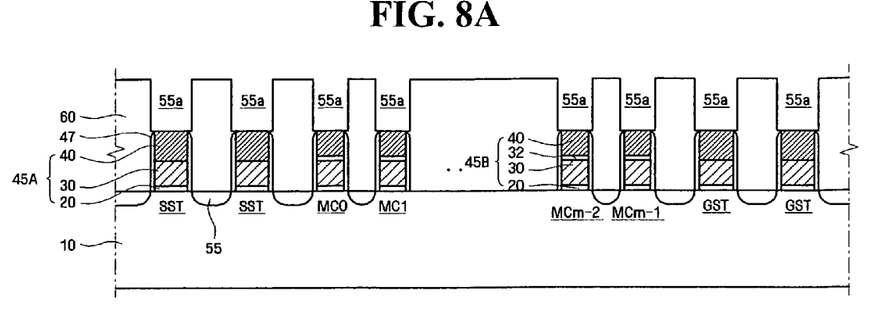
FIGS. 8A and 8B are sectional views of a method of fabricating a non-volatile semiconductor device of the second embodiment, in accordance with the present invention.
Figure 8B:
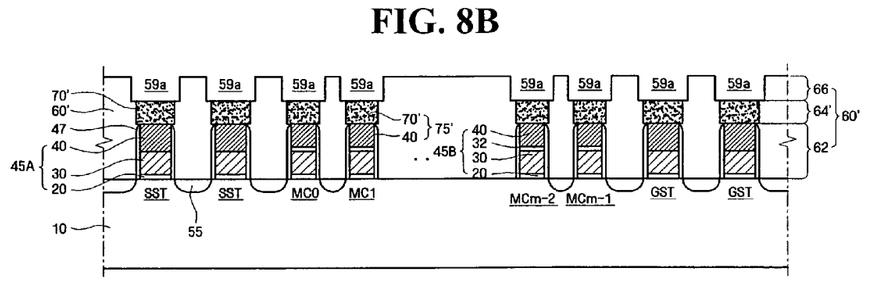

FIGS. 8A and 8B are sectional views of a method of fabricating a non-volatile semiconductor device of the second embodiment, in accordance with the present invention. In this method of fabrication, the first openings 55 of FIG. 7E above are enlarged prior to deposition of the metal patterns 70'. This operates to lower the resistance of the applied metal patterns 70' due to the resulting larger metal width.

In accordance with the second embodiment, a device is fabricated according to the steps described above with reference to FIGS. 7A through 7E. With reference to FIG. 8A, the first openings 55 of the interlayer dielectric insulating layer 60 are enlarged in an enlargement process to form enlarged second openings 55a for the gate patterns of the memory cell MC0, MC1 . . . MCm−2, MCm−1 transistors, the string select transistors SST, and the ground select transistors GST. In one embodiment, the enlargement process comprises a wet cleaning process, as described above.

Following enlargement of the second openings 55a, a metal fill layer is provided on the resulting structure, filling the enlarged second openings 55a with metal. The metal fill layer is planarized, for example using chemical-mechanical polishing, to expose the planar upper surface of the underlying interlayer dielectric insulating layer 60', and to separate the metal fill layer into metal patterns 70'. The metal patterns 70' are then further recessed into the enlarged second openings 55a using an etch back procedure, resulting in the formation of recessed metal patterns 70' on the second polysilicon layer patterns 40, and resulting in third openings in the interlayer dielectric insulating layer 60' above the recessed metal patterns 70'. Together, each second polysilicon layer pattern 40 and associated recessed metal pattern 70' form a control gate 75' for the memory cell MC0, MC1 . . . MCm−2, MCm−1 transistors.

Referring to FIG. 8B, the third openings of the interlayer dielectric insulating layer 60' are further enlarged in a subsequent enlargement process to form enlarged fourth openings 59a for the gate patterns of the memory cell MC0, MC0 . . . MCm−2, MCm−1 transistors, the string select transistors SST, and the ground select transistors GST. In one embodiment, the enlargement process comprises a wet cleaning process, as described above. The enlarged fourth openings 59a are used in subsequent processes to define the resulting positions of self-aligned bit line contacts between adjacent string select transistors SST, and common source line contacts between adjacent ground select transistors GST, and, in the case of NOR-type flash devices, for example, between adjacent memory cells MC0, MC1, . . . . The enlargement process enables self-alignment of the contacts, as described above.

Following this, the process of the second embodiment returns to the step of FIG. 7H above, for application of a mask layer pattern, as described above, and for further processing, as described above.

The method of forming the second embodiment of FIGS. 8A and 8B is advantageous in that the resulting metal patterns 70' of the control gate 75' are greater in width than the width of the underlying polysilicon layer patterns 40 of the control gate 75'. As a result, the resistance of the metal patterns 70' is advantageously lowered due to the larger metal width, increasing operational speed and decreasing power consumption of the device, and lowering the resulting height of the gate.

Figure 9A:
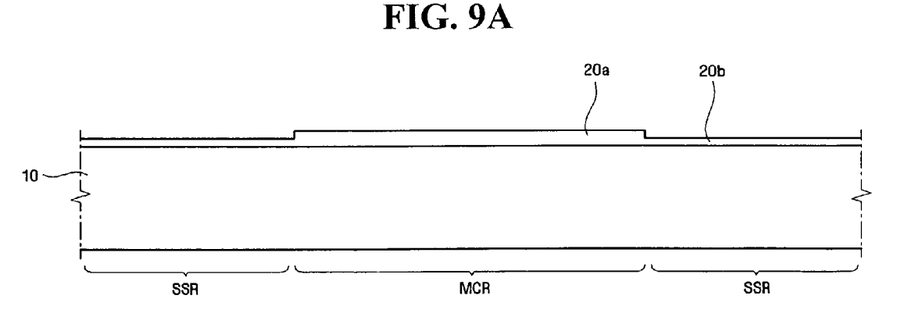
FIGS. 9A-9C are sectional views of a method of fabricating a non-volatile semiconductor device of the third embodiment, in accordance with the present invention
Figure 9B:
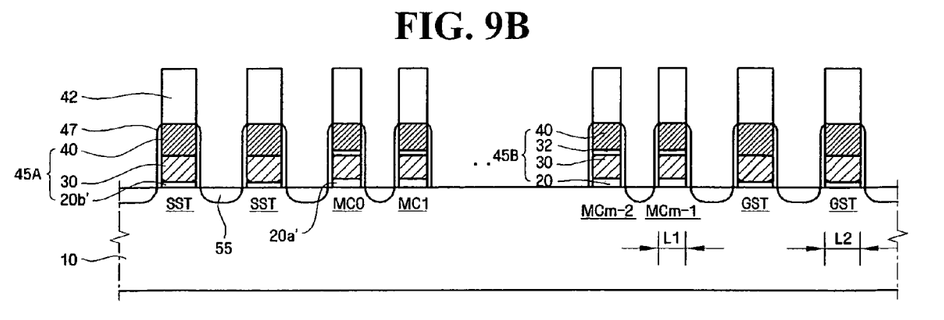
Figure 9C:
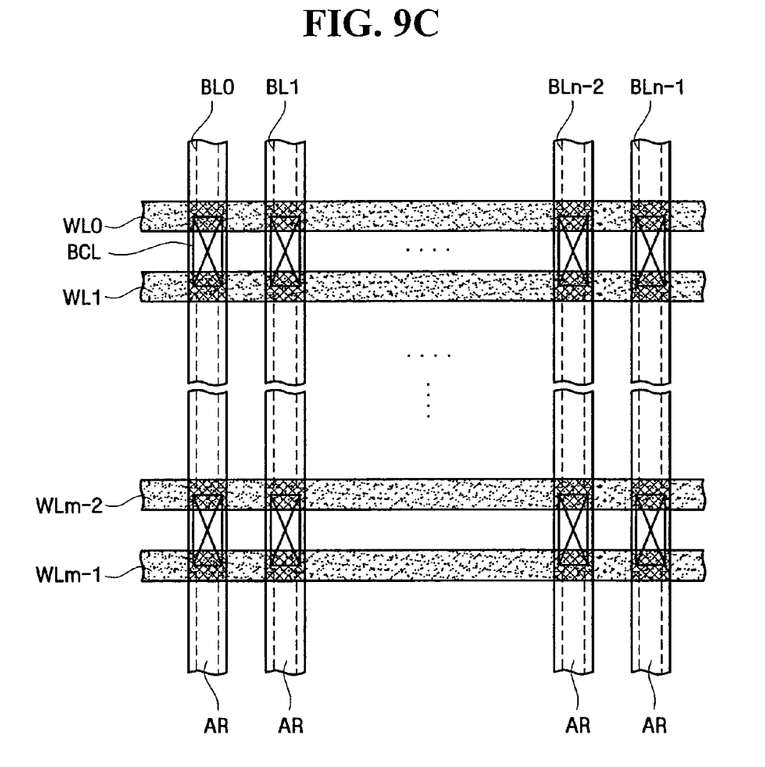

FIGS. 9A and 9B are sectional views of a method of fabricating a non-volatile semiconductor device of the third embodiment, in accordance with the present invention. In this embodiment, the thickness of the thermal oxide layer 20a for the memory cell MC0, MC1 . . . MCm−2, MCm−1 transistors is greater than the thickness of thermal oxide layer 20b for the string select transistors SST, and the ground select transistors GST. In addition, the gate length L1 of the memory cell MC0, MC1 . . . MCm−2, MCm−1 transistors is less than the gate length L2 of the string select transistors SST, and the ground select transistors GST Referring to FIG. 9A, a device is processed in accordance with FIG. 7A to provide trench isolation patterns distributed along the horizontal axis of the cell region, as described above. The hard mask layer 22 and buffer oxide layer 21 used to form the trench isolation patterns are removed, and a tunnel oxide layer 20 is provided on the substrate 10. Following application of the tunnel oxide layer 20, the layer 20 is selectively etched in the selection transistor region SSR of the substrate, a region including, for example, both the string select transistors SST and ground select transistors GST. Selective etching is performed, for example, by applying an etch mask on the memory cell region MCR. As a result the portion of the tunnel oxide layer 20a in the memory cell region MCR is greater in thickness than the remaining tunnel oxide layer 20b in the selection transistor region SSR.

Referring to FIG. 9B, lower gate structures are applied and patterned in accordance with the processes described above in connection with FIGS. 7C and 7D. In the present embodiment, the gate hard mask layer 42 is patterned so that the gate length L1 of the lower gates 45B corresponding to the memory cell MC0, MC1 . . . MCm−2, MCm−1 transistors is less than the gate length L2 of the lower gates 45A corresponding to the string select transistors SST, and the ground select transistors GST. Following this, the process of the third embodiment returns to the step of FIG. 7E above, for application of the interlayer dielectric insulation layer 60, as described above, and for further processing, as described above. In this manner, the advantages described above in connection with FIG. 6 are realized in the fabricated device.

Figure 10:
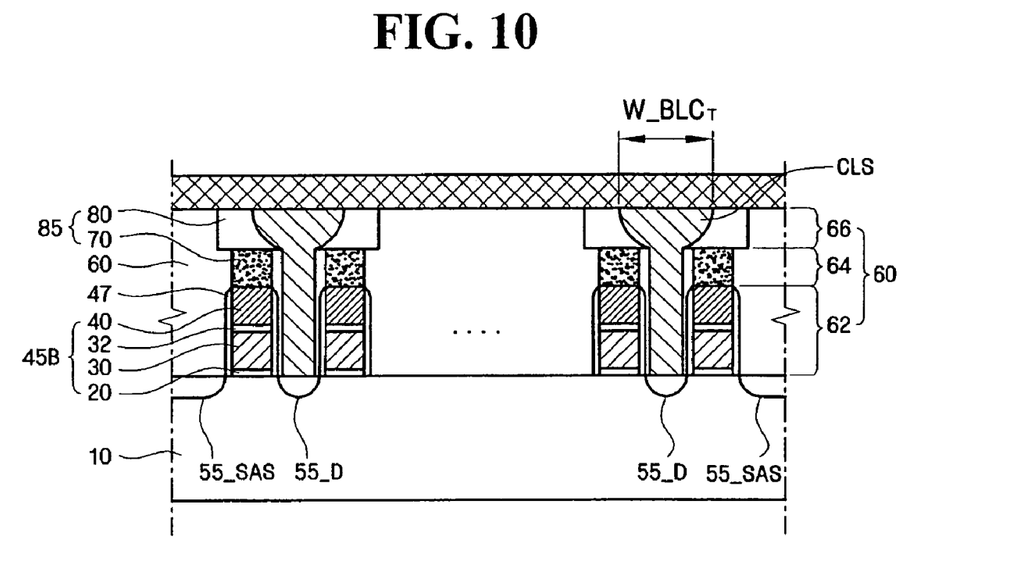
FIG. 10 is a sectional view taken along a bit line of a memory cell region of a memory device, in accordance with the present invention.

FIG. 10 is a sectional view taken along a bit line of a memory cell region of a memory device of a NOR flash memory configuration, in accordance with the present invention. In this embodiment. In the memory cell region of the NOR flash memory configuration, common drain regions 55_D are formed between neighboring memory cells MC0, MC1 . . . MCm−2, MCm−1. Source regions 55_SAS are connected to a common source line. Bit line contacts 93 are provided using the self-aligned fabrication process described above. In particular, mask patterns 80 having a width that is greater than a width of the underlying control gate comprising metal layer 70 and second polysilicon layer 40, and greater than a width of the floating gate 20 are used to define the openings used for the contacts 93 between neighboring memory cells MC0, MC1 . . . MCm−2, MCm−1. The contacts are connected to a common bit line BL patterned on the upper surface of the interlayer dielectric insulating layer 60.

The devices and methods of the present invention provide for a non-volatile memory device configuration and fabrication process that offers several advantages over the conventional device configurations and fabrication processes.

A first advantage is that oxidation of the metal layer of the control gate is avoided. This is because patterning of the lower portion of the gate structure is performed prior to application of the metal layer. Since the metal layer is used as a word line for the device, increase of the resistance of the word lines of the device is thus avoided.

A second advantage is that polymer removal between adjacent gate structures is ensured. A first reason for this is that since patterning of the gate structures occurs prior to application of the metal layer of the control gate, the aspect ratio of the gate structures is relatively low during patterning. Therefore, the etch process is more reliable. In addition, in the absence of the metal layer during patterning, relatively strong wet etch solvents can be used to remove any remaining polymers, since risk of damage to the metal layer by the wet etch solvents is not an issue.

A third advantage lies in that since the lower portion of the gate structure has a relatively low aspect ratio, the risk leaning or bowing of the gate structures due to mechanical stress is lessened. Therefore device fabrication yield and operational reliability is improved.

A fourth advantage lies in that since the metal layer pattern of the control gate is applied in a Damascene-type process, following formation of the interlayer dielectric insulating layer 60, the metal layer pattern can be formed to any desired thickness, and to have an enlarged width as described above in connection with the second embodiment of FIGS. 2, 4A, and 4B. A relatively thicker and wider metal layer, which is used to provide the word lines of the resulting device, leads to lowered resistance in the resulting word lines.

A fifth advantage lies in that the barrier layer in the control gate between the second polysilicon layer 40 and the metal layer 70 is not as important to the fabrication process of the present invention. This is because there is a lessened need for promoting adhesion between the metal layer and the polysilicon layer, and for preventing reaction of silicon atoms of the polysilicon layer with the metal atoms of the metal layer. Since a post-oxidation process is not performed on the metal layer in the present invention, the metal layer is not heated in this manner, which would give rise to the above concerns. In view of this, the inclusion of a barrier layer is less critical to the devices and fabrication methods of the present invention, and, as such, a further reduction in the resulting thickness of the control gate can be achieved.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A semiconductor device comprising:
   a semiconductor substrate;
   multiple floating gate structures, each comprising:
   a tunnel oxide layer pattern on the substrate;
   a floating gate polysilicon layer pattern on the tunnel oxide layer pattern;
   an inter-gate dielectric layer pattern on the floating gate polysilicon layer pattern;
   a control gate polysilicon layer pattern on the inter-gate dielectric layer pattern;
   a control gate metal layer pattern on the control gate polysilicon layer pattern, wherein a width of the control gate metal layer pattern is greater than a width of the control gate polysilicon layer pattern; and
   a hard mask pattern on the control gate metal layer pattern, wherein a lower side of the hard mask pattern contacts the control gate metal layer pattern and a width of the lower side of the hard mask pattern is greater than a width of the control gate metal layer pattern;
   an insulating layer on the substrate and on the multiple floating gate structures; and
   an inter-layer contact in the insulating layer between a pair of the multiple floating gate structures, wherein the inter-layer contact has an upper portion that is wider than a lower portion thereof, and wherein the upper portion of the inter-layer contact overlaps a portion of the control gate metal layer pattern.

2. The semiconductor device of claim 1 wherein the tunnel oxide layer pattern, the floating gate polysilicon layer pattern, the inter-gate dielectric layer pattern, the control gate polysilicon layer pattern and the control gate metal layer pattern comprise a floating gate structure and wherein the floating gate structure is on an active region of the semiconductor substrate, and wherein source and drain regions are in the semiconductor substrate adjacent sidewalls of the floating gate structure.

3. The semiconductor device of claim 1 wherein the control gate metal layer patterns of adjacent floating gate structures are connected to provide one of word lines and bit lines of the semiconductor device.

4. The semiconductor device of claim 1 wherein the hard mask pattern is used for self-alignment of the inter-layer contact.

5. A semiconductor device comprising:
   a semiconductor substrate;
   multiple gate structures, each comprising:
   a tunnel oxide layer pattern on the substrate;
   a first polysilicon layer pattern on the tunnel oxide layer pattern;
   a second polysilicon layer pattern on the first polysilicon layer pattern;
   a metal layer pattern on the second polysilicon layer pattern; and
   a hard mask pattern on the metal layer pattern, wherein a lower side of the hard mask pattern contacts the metal layer pattern and a width of the lower side of the hard mask pattern is greater than a width of the metal layer pattern;
   an insulating layer on the substrate and on the multiple gate structures; and
   an inter-layer contact in the insulating layer between a pair of the multiple gate structures, wherein the inter-layer contact has an upper portion that is wider than a lower portion thereof, and wherein the upper portion of the inter-layer contact overlaps a portion of the metal layer pattern, and
   wherein the hard mask pattern is used for self-alignment of the inter-layer contact.

6. The semiconductor device of claim 5 wherein the first polysilicon layer pattern has a dopant concentration that is different than the second polysilicon layer pattern.

7. The semiconductor device of claim 5 further comprising an inter-gate dielectric layer pattern on the first polysilicon layer pattern, and wherein the semiconductor device comprises a floating gate device.

8. The semiconductor device of claim 5 wherein the semiconductor device comprises a field effect transistor.

9. The semiconductor device of claim 5 further comprising source and drain regions in the semiconductor substrate adjacent sidewalls of the gate structures.

10. The semiconductor device of claim 5 wherein the metal layer patterns of adjacent gate structures are connected to provide one of word lines, bit lines, and transistor selection lines of the semiconductor device.

11. A semiconductor device comprising:
a semiconductor substrate;
multiple gate structures, each comprising:
  a tunnel oxide layer pattern on the substrate;
  a first polysilicon layer pattern on the tunnel oxide layer pattern;
  a second polysilicon layer pattern on the first polysilicon layer pattern;
  a metal layer pattern on the second polysilicon layer pattern, wherein a width of the metal layer pattern is greater than a width of the second polysilicon layer pattern; and
  a hard mask pattern on the metal layer pattern, wherein a lower side of the hard mask pattern contacts the metal layer pattern and a width of the lower side of the hard mask pattern is greater than a width of the metal layer pattern;
an insulating layer on the substrate and on the multiple gate structures; and
an inter-layer contact in the insulating layer between a pair of the multiple gate structures, wherein the hard mask pattern is used for self-alignment of the inter-layer contact, and wherein the inter-layer contact has an upper portion that is wider than a lower portion thereof, and wherein the upper portion of the inter-layer contact overlaps a portion of the metal layer pattern.

* * * * *